United States Patent
Vashchenko et al.

(10) Patent No.: US 7,196,361 B1
(45) Date of Patent: Mar. 27, 2007

(54) CASCODED BI-DIRECTIONAL HIGH VOLTAGE ESD PROTECTION STRUCTURE

(75) Inventors: Vladislav Vashchenko, Palo Alto, CA (US); Willem Kindt, Sunnyvale, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 409 days.

(21) Appl. No.: 10/734,921

(22) Filed: Dec. 12, 2003

(51) Int. Cl.
 *H01R 29/747* (2006.01)
 *H01R 29/87* (2006.01)
(52) U.S. Cl. .................. 257/173; 257/122; 257/141; 257/162; 257/E29.225

(58) Field of Classification Search ................ 257/173
See application file for complete search history.

(56) References Cited

U.S. PATENT DOCUMENTS

| | | | | |
|---|---|---|---|---|
| 4,309,715 A | * | 1/1982 | MacPherson et al. | 257/162 |
| 5,576,557 A | * | 11/1996 | Ker et al. | 257/173 |
| 6,258,634 B1 | * | 7/2001 | Wang et al. | 438/133 |
| 2005/0045909 A1 | * | 3/2005 | Zhang | 257/173 |

* cited by examiner

*Primary Examiner*—Jerome Jackson
(74) *Attorney, Agent, or Firm*—Jurgen Vollrath

(57) ABSTRACT

In a high voltage ESD protection solution, a plurality of DIACs are connected together to define a cascaded structure with isolation regions provided to prevent n-well and p-well punch through. An p-ring surrounds the DIACs and provides a ground for the substrate in which the DIACs are formed.

14 Claims, 3 Drawing Sheets

CASCODED BI-DIRECTIONAL HIGH VOLTAGE ESD PROTECTION STRUCTURE

FIELD OF THE INVENTION

The invention relates to an ESD protection structure. In particular, it deals with a high voltage structure that has bi-directional characteristics.

BACKGROUND OF THE INVENTION

Recent trends in analog product design include the combination of all typical functional blocks of an analog circuit inside a single chip. Ideally, analog chips have to be compatible with both the input/output information signals as well as the power supply of the system. For instance, an analog chip may have to provide the power supply for an output device such as a USB device. When dealing with inductive loads, for example, it is not uncommon to require a 40–60V ESD protection structure to protect the input pads of the integrated circuit (IC) while the core of the circuit uses a 5V process. A typical inductive load situation is the pulse width modulator circuit shown in FIG. 1, which includes an inductive load 100 and a switching NMOS transistor 102. The output signal is derived by means of an operational amplifier 104 connected across a resistor 106. A freewheeling diode 108 provides continuity for current flow when the transistor 102 switches off.

The need for a high voltage solution is becoming particularly acute in the motor vehicle industry where the number of electronic components is not only increasing but a new high voltage standard of 42V is being promoted.

Clearly high voltage technology exists to accommodate high voltage applications, however this high voltage technology is expensive and therefore not always viable, especially in low cost applications such as imaging and low cost sensors. Also, the option of using multiple chips to convert to different voltage levels is not an optimal solution.

Apart from the cost issue associated with high voltage technology, and the use of multiple chips to convert between voltage levels, an additional consideration is the ability to provide bi-directional ESD protection. One prior art bi-directional structure is the NPN triggered structure, which has a triggering and breakdown voltage of about 30V.

As pointed out above, the motor vehicle industry is moving toward a 42V standard, thus there is a need to provide a cost effective high voltage bi-directional ESD protection structure.

SUMMARY OF THE INVENTION

According to the invention, there is provided a bi-directional ESD protection device comprising at least two DIAC devices, each DIAC device comprising a first and a second p-well separated by an n-well, the p-wells and n-well being formed in a p-substrate and separated from the substrate by an n-isolation layer, wherein each p-well has a p-buried layer formed under it and each p-well includes a p+ region and an n+ region. The n+ regions in the two p-wells are preferably on the inside to define a p+, n+, n+, p+ configuration, however other configurations may be used to achieve different voltage distributions.

Preferably at least one additional p+ region in at least one p-well is formed between the two DIAC devices. Preferably said additional p+ region comprises a p+ ring formed in a p-well surrounding each of the DIAC devices. Typically said p+ region is connected to ground.

Typically all of the p+ and n+ regions in the first and second p-wells are connected together, e.g., by means of a first metal layer. The n+ and p+ regions in the first p-well of the one DIAC are typically connected to an input pad, e.g., by means of a second metal layer. The n+ and p+ regions in the second p-well of the other DIAC are typically connected to a ground pad, e.g., by means of the second metal layer. The n+ and p+ regions of the second p-well of the first DIAC are typically connected to the n+ and p+ regions in the first p-well of the other DIAC, e.g. by means of the second metal layer.

DETAILED DESCRIPTION OF THE INVENTION

Figure 1:
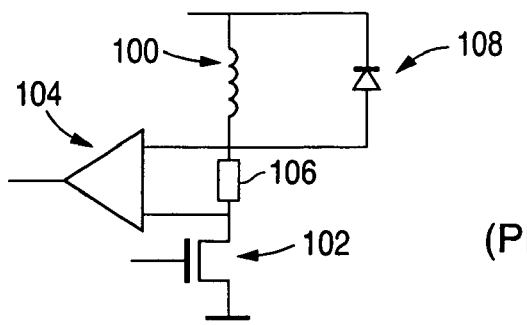
FIG. 1 is a prior art schematic circuit diagram of an inductive load device.
Figure 2:
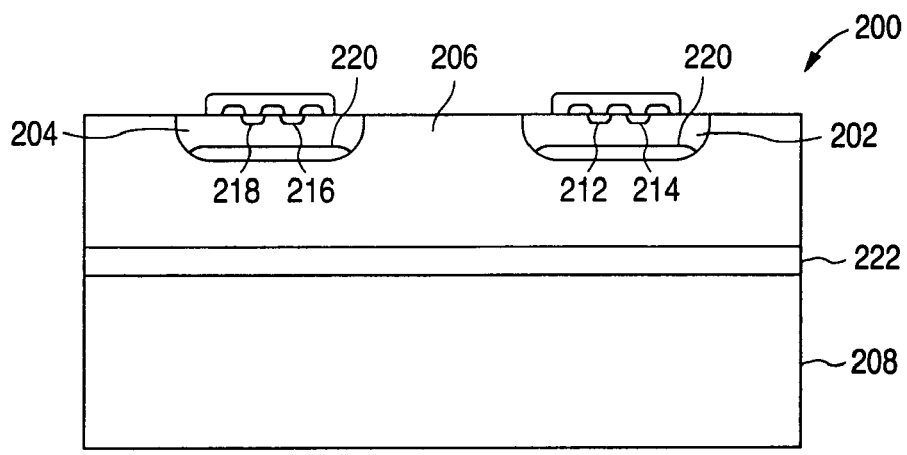
FIG. 2 is a section through a symmetrical DIAC structure known in the art.

FIG. 2 shows and symmetrical p-n-p structure 200, which, for convenience, will be referred to here as a DIAC, comprising two p-wells 202, 204, separated by an n-well 206, and which are all formed in a p-substrate 208. In order to achieve the bi-directional characteristics, a n+ and a p+ region are formed in each of the two p-wells, 202, 204. Thus p-well 202 has n+ region 212 and p+ region 214, while p-well 204 has n+ region 216 and p+ region 218.

To avoid p-well punch through, a p-buried layer (PBL) 220 is formed under each p-well 202, 204. Also, since the p-substrate 208 is grounded, an n-isolation layer (NISO) 222 is included under the p-wells 202, 204, and n-well 206 to avoid n-well punch through.

Figure 3:
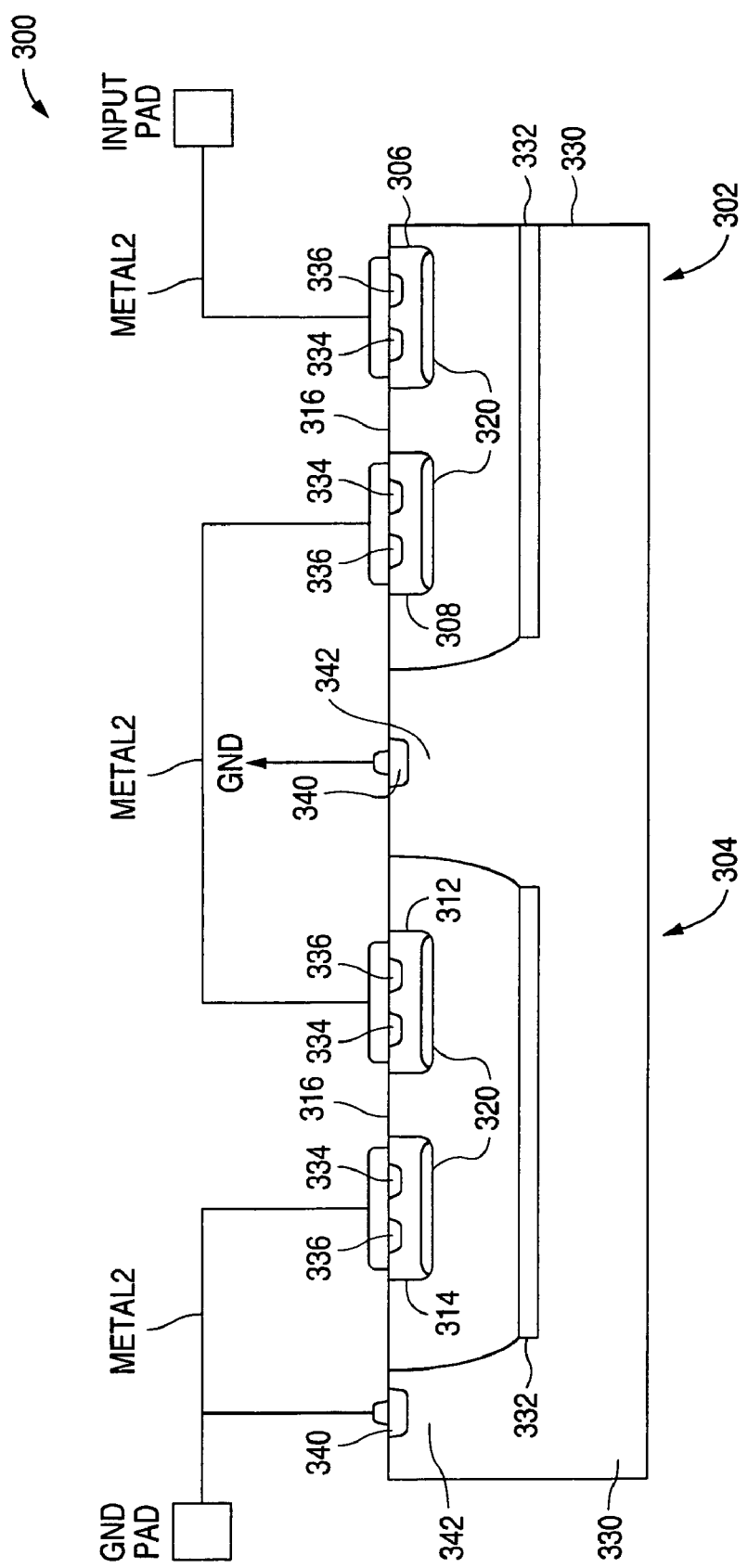
FIG. 3 is a section through one embodiment of a cascaded structure of the invention.

In accordance with the present invention, a high voltage bi-directional structure is achieved without making use of expensive high voltage processes, by providing a cascaded structure, one embodiment of which is shown in FIG. 3.

FIG. 3 shows a simplified representation of a sectional view through a cascaded DIAC structure of the invention. The structure 300 comprises two DIAC structures 302, 304, each having two p-wells, separated by an n-well. Thus DIAC 302 has p-wells 306, 308 separated by n-well 310. DIAC 304 has p-wells 312, 314 separated by n-well 316. As in the DIAC structure shown in FIG. 2, p-buried layers 320 are formed beneath each of the p-wells. Also, the p-wells and n-well of each DIAC are separated from the p-substrate 330 in which they are formed, by an n-isolation layer (NISO) 332. It will be appreciated that even though structurally the device of FIG. 3 is similar to two DIACs side by side, this does not suggest that the two DIACs are separately formed first and then connected. They form part of a single structure, the DIAC elements being formed simultaneously. Thus, for example, it will be apparent that the p-substrate simply continues across where the one DIAC extends into the other one. The NISO 332 also does not continue across both structures.

The bi-directional nature is retained by providing a symmetrical structure with n+ regions 334 and p+ regions 336 in each of the p-wells 306, 308, 312, 314.

In order to ground the p-substrate 330, a p+ring 340 is formed in an additional p-well 342. Since the p+ring 340 is simply connected to ground, the additional p-well 342 does not have a p-buried layer (PBL) in this embodiment. However, in another embodiment a PBL was included.

Figure 4:
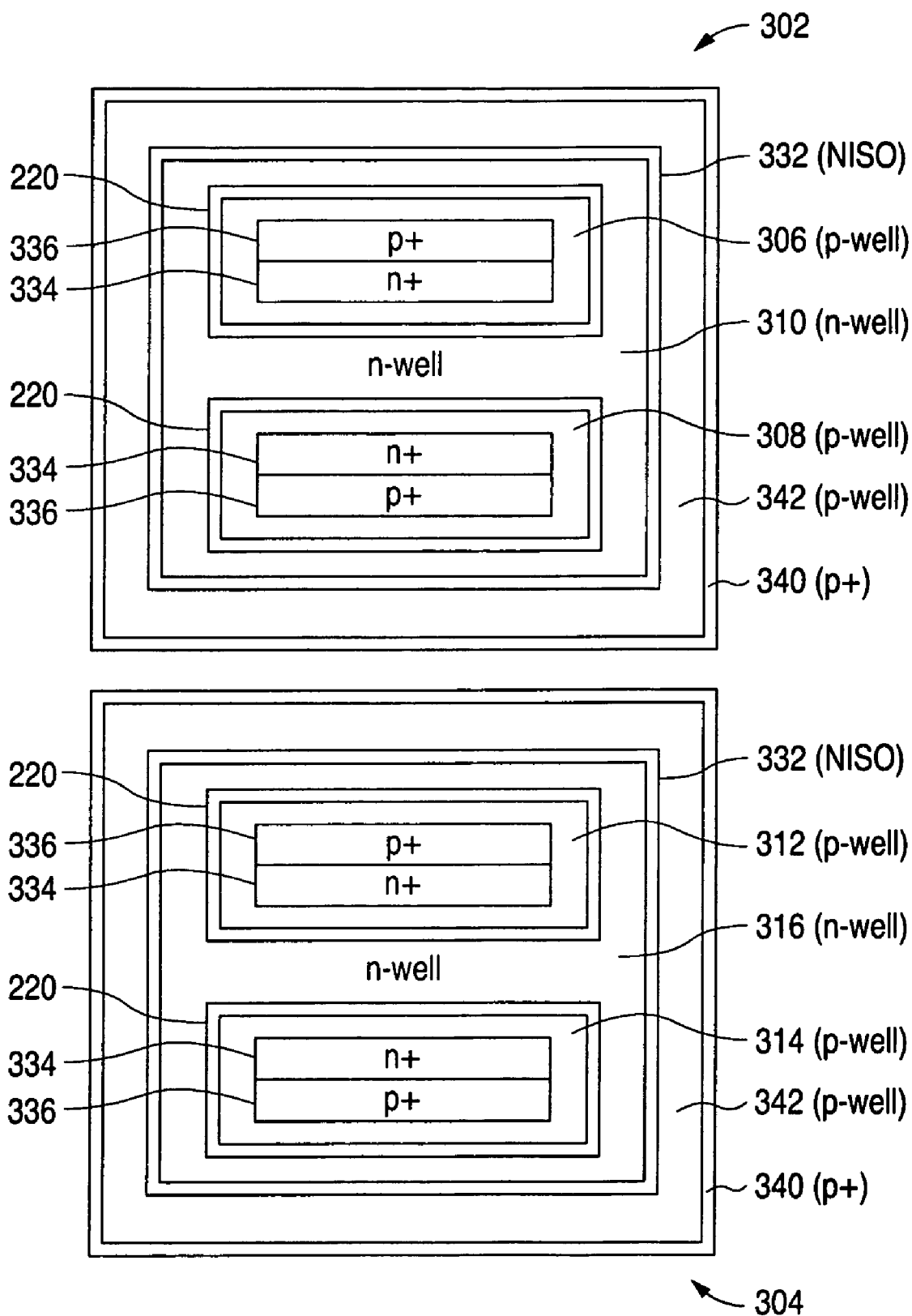
FIG. 4 is a simplified plan view of the structure of FIG. 3.

The configuration of the p+ ring is more clearly shown in FIG. 4 which shows the structure in plan view. FIG. 4 also shows the p+ regions 336 and n+ regions 334 in the p-substrates 306, 308, 312, 314, and the p-buried layers 220 under the p-substrates. The n-well 310 extends between and around the p-wells 312, 314, and is isolated by the NISO 332. Similarly the n-well 316 extends around the p-wells 306, 308, and is isolated by the other NISO 332. The p+ ring 340 is, in effect two rings around each of the DIACs, as shown in FIG. 4. Thus there are actually two p+ regions side by side between the two DIACs. As shown in FIG. 4, the p+ rings are formed in a p-wells 342 which also surrounds the DIACs. For ease of understanding, the two DIACs are labeled with reference numerals 350 and 352 in FIGS. 3 and 4.

Referring again to FIG. 3, the n+ and p+ regions 334, 336 formed in the p-well 306 are connected together by a first metal layer (metal 1) and are connected to the input pad by a second metal layer (metal 2) Metal 1 also connects the n+ and p+ regions in the other p-wells 308, 312, 314. Metal 2 also connects the n+ and p+ regions in p-well 314 to the ground pad, and connects the n+ rings 340 in the p-wells 342 to ground, as shown in FIG. 3.

Figure 5:
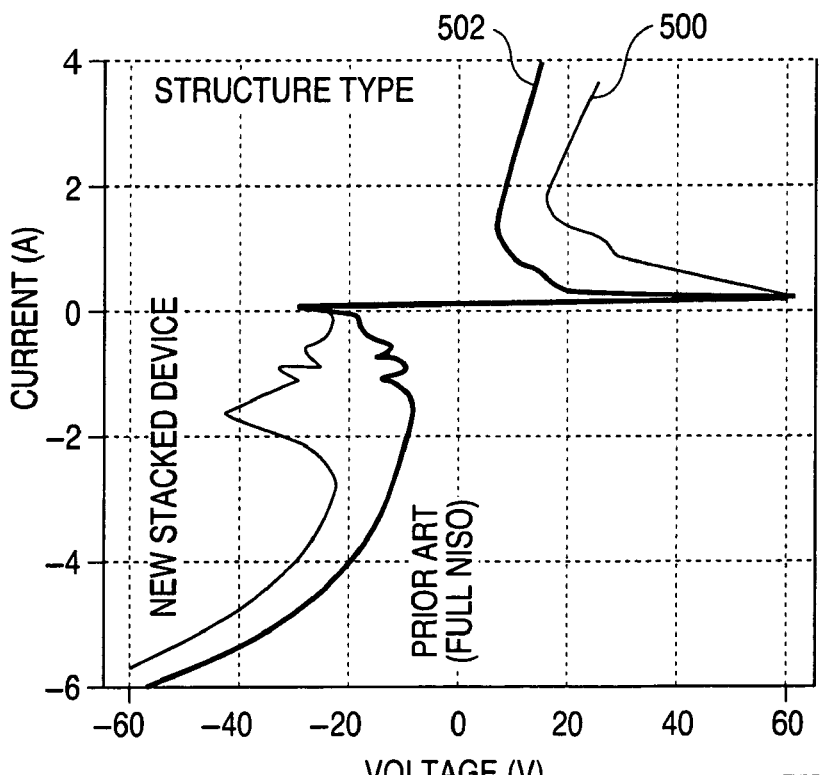
FIG. 5 shows I–V curves for a device of the invention compared to a prior art device.

The high voltage, bi-directional characteristic of the cascaded device of FIGS. 3 and 4 is shown by the Current-Voltage curve in FIG. 5 (curve 500) compared to the non-cascoded structure of FIG. 2 (curve 502).

While the invention was described with respect to a particular embodiment, it will be appreciated that the invention covers all configurations within the scope of the claims.

What is claimed is:

1. A bi-directional ESD protection device, comprising two DIAC devices, each DIAC device comprising a first and a second p-well formed in an n-well the n-well being formed in a p-substrate and isolated from the substrate by an n-isolation layer, wherein each of the first and second p-well has a p-buried layer formed under it and each p-well includes a p+ region and an n+ region formed in it, the bi-directional ESD protection device further comprising an additional p-region comprises a p+ ring formed in a p-well surrounding each of the DIAC devices.

2. The device of claim 1, wherein the n+ regions in the two p-wells face each other to define a p+, n+, n+, p+ configuration.

3. The device of claim 1, wherein said p+ region is connected to ground.

4. The device of claim 1, wherein for each DIAC, the p+ and n+ regions in the first and second p-wells are connected together.

5. The device of claim 4, wherein the p+ and n+ regions in the first and second p-wells are connected together by means of a first metal layer.

6. The device of claim 4, wherein the n+ and p+ regions in the first p-well of the one DIAC are connected to an input pad.

7. The device of claim 5, wherein the n+ and p+ regions in the first p-well of the one DIAC are connected to an input pad.

8. The device of claim 7, wherein the n+ and p+ regions in the first p-well of the one DIAC are connected to the input pad by means of a second metal layer.

9. The device of claim 6, wherein the n+ and p+ regions in the second p-well of the other DIAC are connected to a ground pad.

10. The device of claim 9, wherein the n+ and p+ regions in the second p-well of the other DIAC are connected to the ground pad by means of a second metal layer.

11. The device of claim 8, wherein the n+ and p+ regions in the second p-well of the other DIAC are connected to a ground pad.

12. The device of claim 11, wherein the n+ and p+ regions in the second p-well of the other DIAC are connected to the ground pad by means of the second metal layer.

13. The device of claim 9, wherein the n+ and p+ regions of the second p-well of the first DIAC are connected to the n+ and p+ regions in the first p-well of the other DIAC.

14. The device of claim 12, wherein the n+ and p+ regions of the second p-well of the first DIAC are connected to the n+ and p+ regions in the first p-well of the other DIAC by means of the second metal layer.

* * * * *